United States Patent
Sugahara et al.

(10) Patent No.: US 7,262,433 B2
(45) Date of Patent: Aug. 28, 2007

(54) SEMICONDUCTOR DEVICE

(75) Inventors: Kazuyuki Sugahara, Hyogo (JP); Naoki Nakagawa, Hyogo (JP); Yoshihiko Toyoda, Hyogo (JP); Takao Sakamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 108 days.

(21) Appl. No.: 11/137,660

(22) Filed: May 26, 2005

(65) Prior Publication Data

US 2005/0263770 A1 Dec. 1, 2005

(30) Foreign Application Priority Data

May 28, 2004 (JP) ............................. 2004-159597

(51) Int. Cl.
*H01L 27/12* (2006.01)
(52) U.S. Cl. .................. 257/72; 257/57; 257/347; 257/E29.151
(58) Field of Classification Search .................. 257/72, 257/57, 347, E29.151
See application file for complete search history.

(56) References Cited

U.S. PATENT DOCUMENTS 6,365,917 B1* 4/2002 Yamazaki .................... 257/72

6,746,965 B2* 6/2004 Uehara et al. .............. 438/713
2005/0263770 A1 12/2005 Sugahara et al.

FOREIGN PATENT DOCUMENTS

| JP | 2000-252473 | 9/2000 |
| JP | 2002-76351 | 3/2002 |
| JP | 2002-231953 | 8/2002 |

OTHER PUBLICATIONS

Web Document by Wikipedia about Polycrystalline Silicon or Polysilicon (2 pages).*
U.S. Appl. No. 11/091,570, filed Mar. 29, 2005, Toyoda et al.
U.S. Appl. No. 11/109,818, filed Apr. 20, 2005, Toyoda et al.
U.S. Appl. No. 11/137,660, filed May 26, 2005, Sugahara et al.
U.S. Appl. No. 11/376,414, filed Mar. 16, 2006, Toyoda et al.

* cited by examiner

*Primary Examiner*—Andy Huynh
*Assistant Examiner*—Thinh T Nguyen
(74) *Attorney, Agent, or Firm*—Oblon, Spivak, McClelland, Maier & Neustadt, P.C.

(57) ABSTRACT

A first thin film transistor including a gate electrode, a source region, a drain region, a GOLD region, and a channel region is formed at a first region at a TFT array substrate. A second thin film transistor including a gate electrode, a source region, drain region, a GOLD region, and a channel region is formed at a second region. The GOLD length (0.5 μm) of the GOLD region of the second thin film transistor is set shorter than the GOLD length (1.5 μm) of the GOLD region of the first thin film transistor. Accordingly, a semiconductor device directed to reducing the area occupied by semiconductor elements is obtained.

10 Claims, 10 Drawing Sheets

SEMICONDUCTOR DEVICE

BACKGROUND OF THE INVENTION

1. Field of the Invention

The present invention relates to semiconductor devices, particularly a semiconductor device applied to display devices such as a liquid crystal display device and organic EL (Electro Luminescence) display device.

2. Description of the Background Art

A thin film transistor is used in a display device. As an example of such a thin film transistor, a thin film transistor of a GOLD (Gate Overlapped Lightly Doped Drain) structure disclosed in Japanese Patent Laying-Open No. 2000-252473 will be described hereinafter. An n type thin film transistor of a GOLD structure has a source region, a drain region, a channel region, a GOLD region, a gate insulation film, a gate electrode and the like formed on a glass substrate.

At a region between the channel region and the drain region, the GOLD region is formed particularly at a region located right under the gate electrode, overlapping with the gate electrode in plane. The GOLD region has an impurity concentration higher than that of the channel region, and lower than that of the drain region.

The operation of an n type thin film transistor of such a GOLD structure will be described here. By applying a predetermined positive voltage to the gate, a channel is formed at the channel region. The resistance between the source region and the drain region is reduced, allowing a current flow across the source region and the drain region.

Application of a voltage to the drain higher than that to the gate will generate a relatively large electric field at the junction of the drain side. Electrons accelerated by this electric field induce impact ionization, whereby a pair of an electron and hole is generated. Impact ionization is repeated to increase the pairs of electrons and holes, causing increase in the drain current to result in avalanche breakdown. The drain voltage at this stage becomes the source-drain breakdown voltage.

In the present description, the source-drain breakdown voltage corresponds to the drain voltage when 0V is applied to the gate electrode and the drain current across the source and drain is 0.1 µA per 1 µm gate width.

The GOLD region is provided to improve such source-drain breakdown voltage, and is formed overlapping with the gate electrode at a region between the channel region and drain region. Generally, the impurity concentration of the GOLD region is set lower than that of the drain region. According to such a configuration, the electric field in the proximity of the drain is alleviated at the junction between the channel region and GOLD region, so that impact ionization can be suppressed. Therefore, the source-drain breakdown voltage can be improved.

By setting the length of the GOLD region in the direction of the channel length longer, the source-drain breakdown voltage can be further improved.

The conventional semiconductor device has a problem set forth below. In a conventional semiconductor device, the GOLD length of the GOLD region is set identical with respect to all the N channel type thin film transistors of a GOLD structure. Therefore, it was necessary to set a long GOLD length in conformance with the n channel type thin film transistor that needs the highest source-drain breakdown voltage among the thin film transistors formed at the TFT (Thin Film Transistor) array substrate. In other words, a long GOLD length had to be set in conformance with the n channel type thin film transistor to which the highest voltage is applied.

This means that an n channel type thin film transistor that does not need such a long GOLD length since the applied voltage is relatively low was also set to have a long GOLD length.

Therefore, the area occupied by the thin film transistors is increased since a long GOLD length is set even for a thin film transistor that does not essentially require such a long GOLD length. This induces the problem that the number of TFT array substrates fabricated from one glass substrate is reduced to increase the fabrication cost.

SUMMARY OF THE INVENTION

In view of the foregoing, an object of the present invention is to provide a semiconductor device directed to reducing the area occupied by the semiconductor element.

A semiconductor device according to the present invention includes a plurality of semiconductor elements, each having a semiconductor layer, an insulation film, and an electrode formed on a predetermined substrate. Each of the plurality of semiconductor elements includes a first impurity region, a second impurity region, a channel region, a third impurity region, and a fourth impurity region. The first impurity region is formed at the semiconductor layer, and has a predetermined impurity concentration. The second impurity region is formed at the semiconductor layer with a distance from the first impurity region, and has a predetermined impurity concentration. The channel region functions as a channel having a predetermined channel length, and is formed at a region of the semiconductor layer between the first impurity region and the second impurity region with respective distances from the first impurity region and the second impurity region. The third impurity region is formed in contact with the channel region, at a region of the semiconductor layer between the first impurity region and the channel region. The third impurity region has an impurity concentration lower than the impurity concentration of the first impurity region. The fourth impurity region is formed in contact with the channel region at a region of the semiconductor layer between the second impurity region and the channel region. The fourth impurity region has an impurity concentration lower than the impurity concentration of the second impurity region. In each of the plurality of semiconductor elements, the insulation film is formed between the semiconductor layer and the electrode so as to come into contact with each of the semiconductor layer and the electrode. The electrode has one side and another side opposite to each other, and is formed overlapping with and facing the channel region, a portion of the third impurity region, and a portion of the fourth impurity region. An overlapping region between the electrode and the third impurity region arranged facing each other, starting from a region where a plane including the one side intersects the semiconductor layer up to the channel region, and an overlapping region between the electrode and the fourth impurity region arranged facing each other, starting from a region where a plane including the another side intersects the semiconductor layer up to the channel region have a predetermined overlapping length in the direction of the channel length. The plurality of semiconductor elements include a first element having a first overlapping length as the predetermined overlapping length, and a second element having a second overlapping length shorter than the first overlapping length as the predetermined overlapping length.

By employing a second element having a second overlapping length in addition to a first element having a first overlapping length in accordance with the property required by the semiconductor device, the area occupied by the second element is reduced to allow reduction of the area occupied by the semiconductor elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
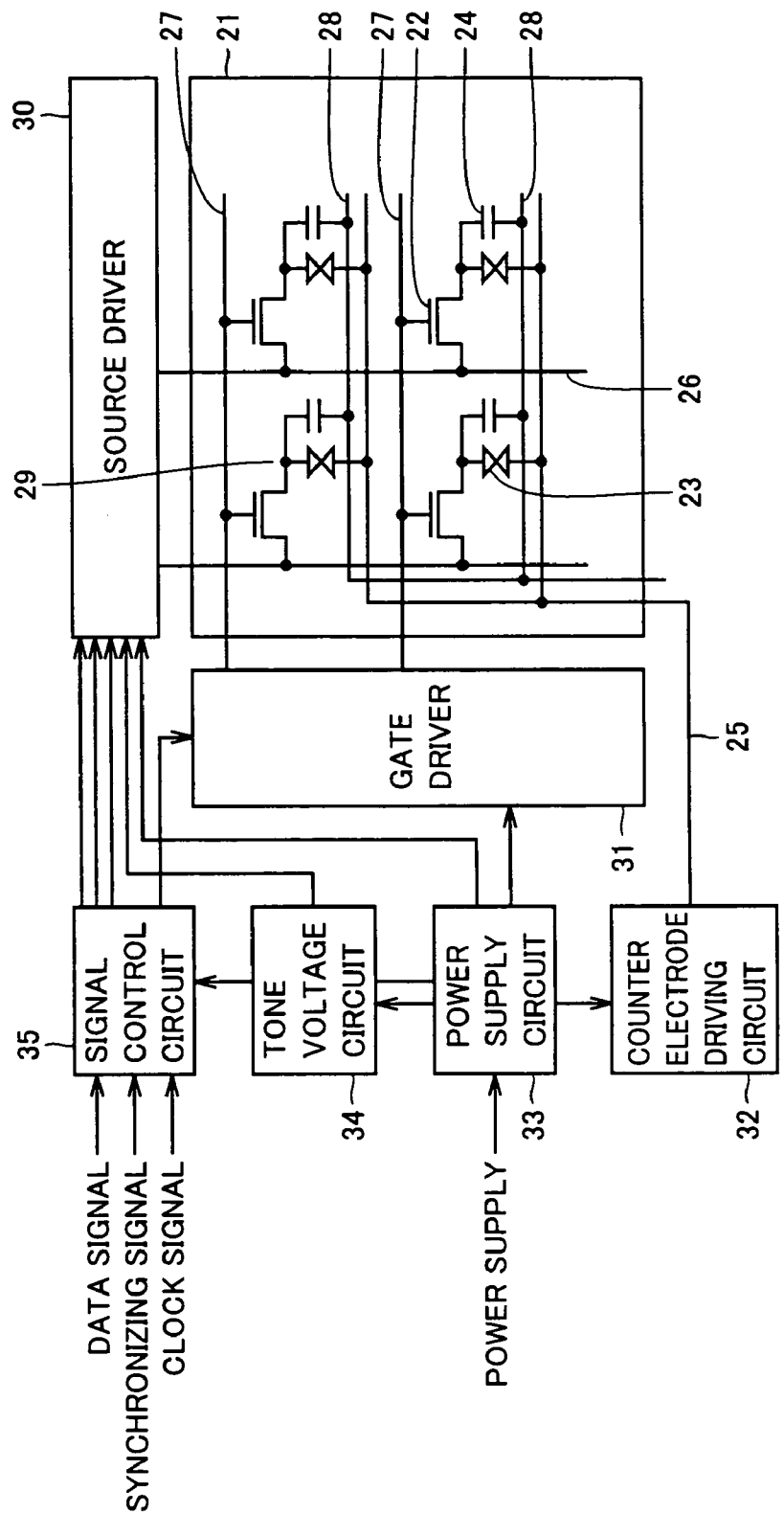
FIG. 1 is a block diagram of a configuration of a TFT array substrate of a liquid crystal display device according to a first embodiment of the present invention.

A liquid crystal display device will be described hereinafter as a semiconductor device according to a first embodiment of the present invention. FIG. 1 is a block diagram of a configuration of a TFT array substrate of the liquid crystal display. A pixel unit 21 for displaying an image includes a pixel thin film transistor 22, liquid crystal (pixel capacitance) 23, storage capacitance 24, a common electrode (common line) 25, a data line 26, an address line 27, a Cs (common source) line 28, and a pixel electrode 29.

In the neighborhood of pixel unit 21 are located a source driver 30, a gate driver 31, a counter electrode driving circuit 32, a power supply circuit 33, a tone voltage circuit 34, and a signal control circuit 35. Each of the above-described circuits, i.e. source driver 30 to signal control circuit 35, is constituted of a thin film transistor formed on a glass substrate. Driving circuitry to drive pixel unit 21 includes source driver 30, counter electrode driving circuit 32, and tone voltage circuit 34.

The operation of the TFT array substrate will be described briefly here. A predetermined power supply voltage is supplied from an external source (not shown) of the TFT array substrate to power supply circuit 33, from which the required voltage is supplied to each of source driver 30, gate driver 31, counter electrode driving circuit 32, tone voltage circuit 34, and signal control circuit 35.

A data signal that is a video signal, a synchronizing signal for establishing synchronization, and a clock signal are applied from an external source of the TFT array substrate to signal control circuit 35. Signal control circuit 35 supplies a data signal, control signal, and clock signal to source driver 30, as well as a control signal and clock signal to gate driver 31. Tone voltage circuit 34 supplies to source driver 30 ten tone voltages used in the output voltage generation of source driver 30. Counter electrode driving circuit 32 supplies common voltage to common electrode 25 opposite to pixel electrode 29.

Source driver 30 sequentially latches each pixel data of 6 bits, for example, of the RGB signals as the pixel data signal sent from signal control circuit 35 at the timing of the clock signal sent from signal control circuit 35. The pixel data is converted into an analog signal by a DA converter of 6 bits in source driver 30. The analog signal is supplied onto data line 26 of pixel unit 21.

Gate driver 31 includes a shift register and an output, circuit. The register conducts a shift operation according to the clock signal from signal control circuit 35. The output circuit is switched to the ON voltage and OFF voltage of pixel thin film transistor 22 when the register attains an H (high) level and an L (low) level, respectively. Gate driver 31 sequentially applies ON/OFF voltage to an address line 27 (gate of pixel thin film transistor 22) of pixel unit 21.

Pixel thin film transistor 22 connected to address line 27 to which ON voltage is applied by gate driver 31 is turned on. During this ON period, a voltage signal (analog signal) corresponding to respective pixel data sent to respective data lines 26 from source driver 30 is provided to storage capacitance 24.

At storage capacitance 24, a voltage corresponding to the provided analog signal is maintained for the duration of 1 frame (generally 16.7 msec.) during which the entirety of pixel unit 21 is displayed once. In other words, the voltage of pixel electrode 29 is maintained at the voltage level corresponding to the provided analog signal during one frame.

The voltage of pixel capacitance 23, i.e. the voltage applied to the liquid crystal, is determined by the voltage of pixel electrode 29 and common electrode 25 sent from counter electrode driving circuit 32. The alignment status of liquid crystal (pixel capacitance 23) depends upon such voltage, whereby the intensity of light transmitted through the liquid crystal is determined.

After a voltage is applied corresponding to respective analog signals corresponding to all the pixel electrodes 29 connected to one address line 27, that address line 27 attains the level of OFF voltage, whereby pixel thin film transistor 22 is turned off. Then, ON voltage is applied with respect to the next address line 27 (the next address signal located below). An operation similar to that of the preceding address line 27 is conducted, whereby a voltage is applied corresponding to respective analog signals corresponding to each of the pixel electrodes 29 connected to one address line 27. Through the above-described operation on all the address lines 27, image display of one frame is completed. Cs line 28 is generally connected to ground.

The operating voltage of each circuit will be described here. The voltage of the data signal, synchronizing signal, clock signal, and the power supply applied from an external source of the TFT array substrate is set to 3.3V. Inherently, the data signal, the synchronizing signal, and the clock signal vary in the range of 0V to 3.3V. Furthermore, signal control circuit 35 and gate driver 31 both operate at the power supply voltage of 3.3V.

The voltage of each of pixel thin film transistor 22, source driver 30, counter electrode driving circuit 32 and tone voltage circuit 34 of pixel unit 21 is set to 5V. This is because the voltage of 5V is required to drive the liquid crystal (pixel capacitance 23).

To this end, power supply circuit 33 supplies a voltage of 3.3V to signal control circuit 35 and gate driver 31, and supplies a voltage of 5V generated by a boosting circuit to pixel thin film transistor 22, source driver 30, counter electrode driving circuit 32 and tone voltage circuit 34.

Figure 2:
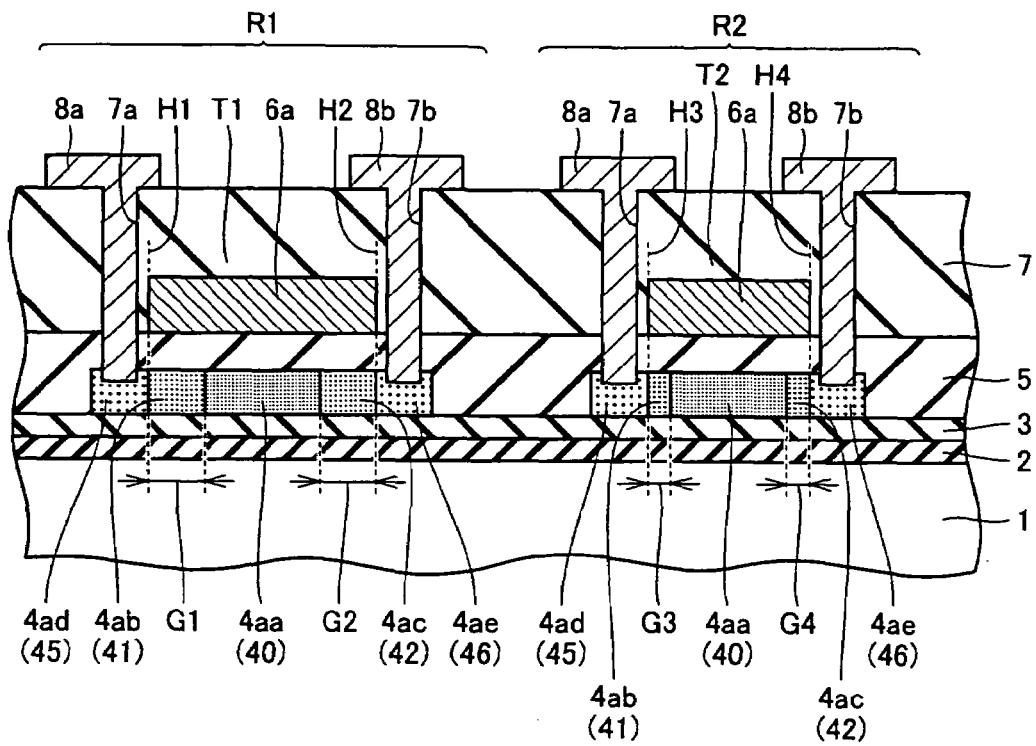
FIG. 2 is a sectional view of a TFT array substrate of the first embodiment.

The configuration of the thin film transistor formed on the TFT array substrate will be described hereinafter. Referring to FIG. 2, a silicon nitride film 2 is formed to a thickness of approximately 50 nm on a non-alkali glass substrate 1. A silicon oxide film 3 is formed to a thickness of approximately 100 nm on silicon nitride film 2. An island-shape polycrystalline silicon film is formed above the region of silicon oxide film 3 located at a region R1.

At the polycrystalline silicon film are formed a source region 45 having a predetermined impurity concentration, and a drain electrode 46 having a predetermined impurity concentration, with a distance from source region 45. At the region between source region 45 and the drain region 46, a channel region 40 having a predetermined channel length is formed with respective distances from source region 45 and drain region 46.

A GOLD region 41 is formed at a region between source region 45 and channel region 40. A GOLD region 42 is formed at a region between drain region 46 and channel region 40. The impurity concentration of each of GOLD regions 41 and 42 is set higher than that of channel region 40 and lower than that of source and drain regions 45 and 46.

An island-shaped polycrystalline silicon film is also formed above a region of silicon oxide film 3 located at region R2. Likewise region R1, channel region 40, source region 45, drain region 46, and GOLD regions 41 and 42 having a predetermined impurity concentration are formed at this polycrystalline silicon film.

A gate insulation film 5 of a silicon oxide film is formed to a thickness of approximately 100 nm so as to cover the island-shaped polycrystalline silicon film. A gate electrode 6a is formed above gate insulation film 5 at each of regions R1 and R2. An interlayer insulation film 7 of a silicon oxide film is formed to a thickness of approximately 500 nm, for example, so as to cover gate electrode 6a.

A contact hole 7a exposing the surface of source region 45 and a contact hole 7b exposing the surface of drain region 46 is formed at respective regions of interlayer insulation film 7 located at region R1. Source electrode 8a and drain electrode 8b are formed on interlayer insulation film 7 so as to fill contact holes 7a and 7b, respectively.

Also, contact hole 7a exposing the surface of source region 45 and contact hole 7b exposing the surface of drain region 46 is formed at respective regions of interlayer insulation film 7 located at region R2. Source electrode 8a and drain electrode 8b are formed on interlayer insulation film 7 so as to fill contact holes 7a and 7b, respectively Thus, a thin film transistor T1 including gate electrode 6a, source region 45, drain region 46, GOLD regions 41 and 42, and channel region 40 is implemented at region R1. At region R2, a thin film transistor T2 including gate electrode 6a, source region 45, drain region 46, GOLD regions 41 and 42, and channel region 40 is implemented.

Each gate electrode 6a of thin film transistors T1 and T2 is formed so as to cover channel region 40 entirely, and to overlap in plane with GOLD region 41 and GOLD region 42.

Specifically, at thin film transistor T1, the junction between one GOLD region 41 and source region 45 is located substantially on the same plane H1 as one side of gate electrode 6a, whereas the junction between the other GOLD region 42 and drain region 46 is located substantially on the same plane H2 as the other side of gate electrode 6a.

At thin film transistor T2, the junction between one GOLD region 41 and source region 45 is located substantially on the same plane H3 as the one side of gate electrode 6a, whereas the junction between the other GOLD region 42 and drain region 46 is located substantially on the same plane H4 as the other side of gate electrode 6a.

In thin film transistors T1 and T2, source region 45 includes phosphorus as the impurity at the concentration of $5 \times 10^{20}$ atom/cm$^3$. Drain region 46 includes phosphorus as the impurity at the concentration of $5 \times 10^{20}$ atom/cm$^3$. GOLD regions 41 and 42 include phosphorus as the impurity at the concentration of $1 \times 10^{18}$ atom/cm$^3$. It is to be noted that channel region 40 does not include impurities that are electrically active.

The length of channel region 40, i.e. the effective gate length, is set to 3 μm. The lengths G1 and G2 of GOLD regions 41 and 42, respectively, of thin film transistor T1 in the direction of the channel length (GOLD length) are both set to 1.5 μm. The GOLD lengths G3 and G4 of GOLD regions 41 and 42, respectively, of thin film transistor T2 are both set to 0.5 μm.

Figure 3:
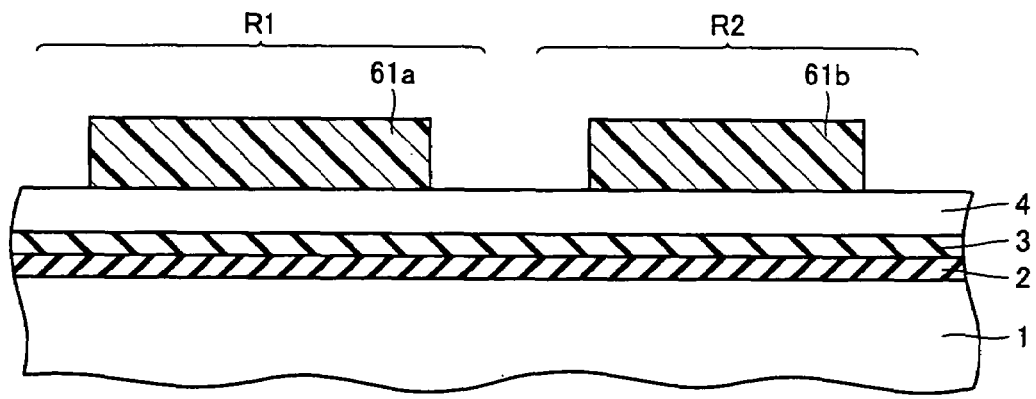
FIG. 3 is a sectional view of the TFT array substrate of the first embodiment shown in FIG. 2, representing a step in a fabrication method thereof

A fabrication method of the TFT array substrate of a liquid crystal display device set forth above will be described hereinafter. Referring to FIG. 3, silicon nitride film 2 of approximately 50 nm in film thickness is deposited by plasma CVD (Chemical Vapor Deposition), for example, on the main surface of a glass substrate 1 of Type 1737 made by Corning Inc., as the substrate. Silicon oxide film 3 of approximately 100 nm in film thickness is formed on silicon nitride film 2. Then, an amorphous silicon film of approximately 50 nm in film thickness is formed on silicon oxide film 3.

Silicon nitride film 2 is provided to prevent the impurities included in glass substrate 1 from diffusing upwards. As a film to prevent such impurity diffusion, the material of SiON, SiC, AlN, $Al_2O_3$, and the like may be applied in addition to the silicon nitride film. Although a double-layer structure of silicon nitride film 2 and silicon oxide film 3 is provided as the underlying film of amorphous silicon film 4, the present invention is not limited to such a double-layer structure. Such films may be omitted, or another film may be additionally layered.

By subjecting the amorphous silicon film to heat treatment in predetermined vacuum, hydrogen, present in amorphous silicon film 4 and that is not required, is removed. Then, the amorphous silicon film is irradiated with a laser beam by XeCl laser, for example, to be rendered polycrystalline, resulting in a polycrystalline silicon film 4, as shown in FIG. 3. Polycrystalline silicon film 4 has a grain size of approximately 0.5 µm.

Figure 4:
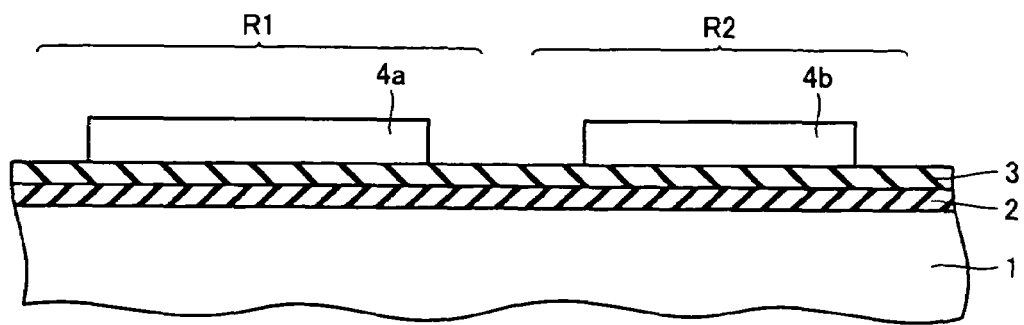
FIG. 4 is a sectional view of the TFT array substrate of the first embodiment, representing a step carried out after the step of FIG. 3.

At the region of polycrystalline silicon film 4 located at region R1, a resist pattern 61a is formed. At the region of polycrystalline silicon film 4 located at region R2, a resist pattern 61b is formed. Using resist patterns 61a and 61b as masks, polycrystalline silicon film 4 is subjected to anisotropic etching, whereby island-shaped polycrystalline silicon films 4a and 4b are obtained at regions R1 and R2, respectively, as shown in FIG. 4. Subsequently, ashing and chemical treatment are applied to remove resist patterns 61a and 61b.

Figure 5:
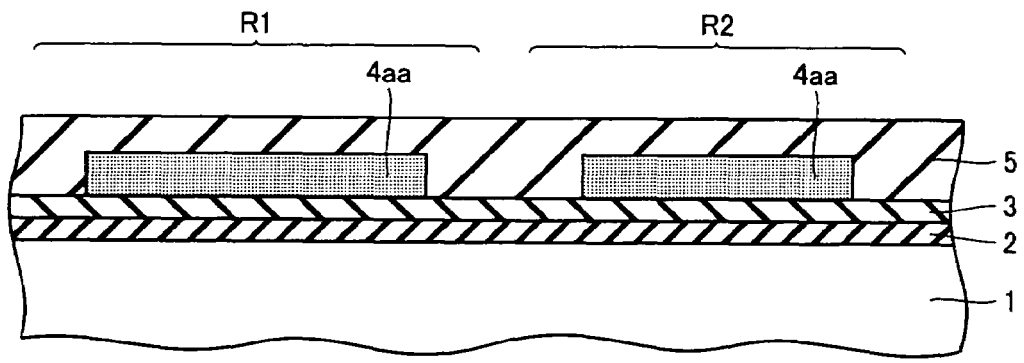
FIG. 5 is a sectional view of the TFT array substrate of the first embodiment, representing a step carried out after the step of FIG. 4.

Then, gate insulation film 5 of silicon oxide film is formed so as to cover polycrystalline silicon films 4a and 4b. Boron is implanted into the polycrystalline silicon film with a dosage of $1\times10^{12}$ atom/cm$^2$ and acceleration energy of 60 KeV, for example, to control the threshold value of the thin film transistor. Island-shaped impurity regions 4aa are formed as shown in FIG. 5.

Figure 6:
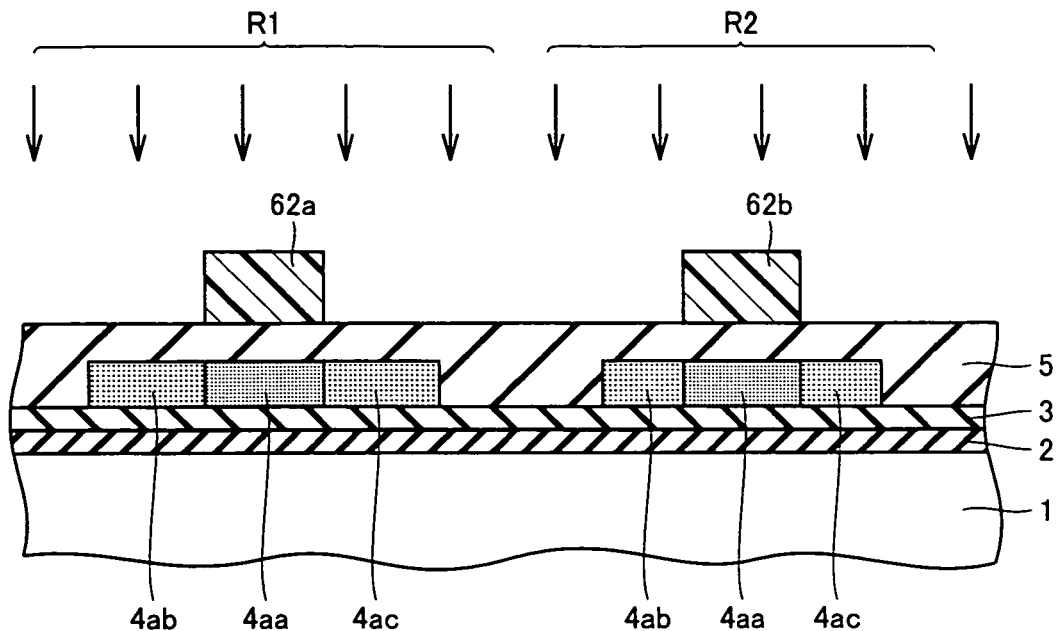
FIG. 6 is a sectional view of the TFT array substrate of the first embodiment, representing a step carried out after the step of FIG. 5.

Referring to FIG. 6, predetermined photolithography is applied to obtain resist pattern 62a required to form thin film transistor T1 at region R1, and resist pattern 62b required to form thin film transistor T2 at region R2.

Using resist patterns 62a and 62b as masks, phosphorus is implanted into impurity region 4aa with a dosage $7\times10^{12}$ atom/cm$^2$ and acceleration energy of 80 KeV, for example, whereby impurity regions 4ab and 4ac are obtained at regions R1 and R2, respectively. The implanted amount thereof corresponds to the amount of implantation ($1\times10^{18}$ atom/cm$^3$) at the GOLD region. Then, ashing and chemical treatment are applied to remove resist patterns 62a and 62b.

Figure 7:
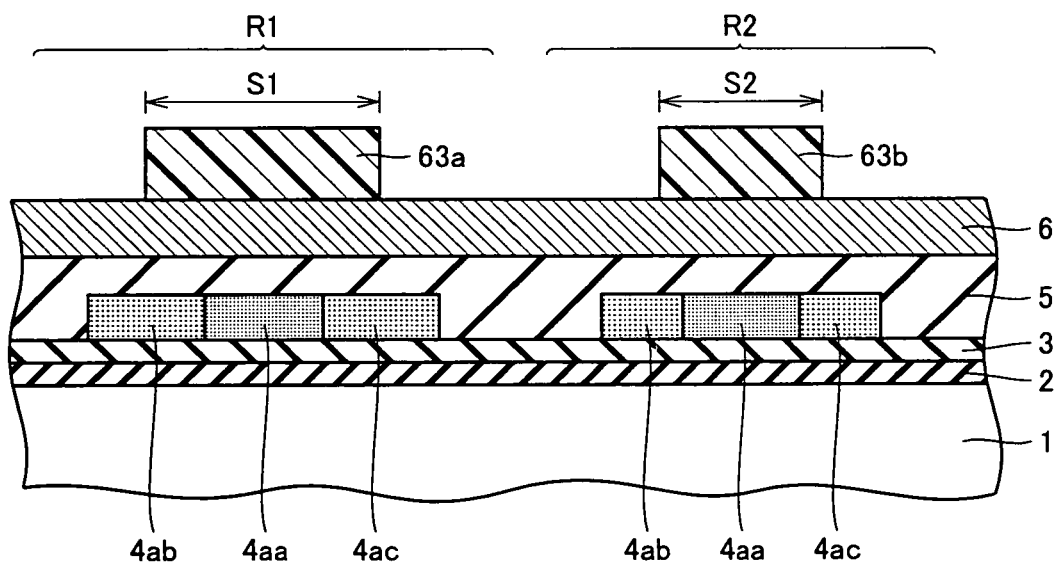
FIG. 7 is a sectional view of the TFT array substrate of the first embodiment, representing a step carried out after the step of FIG. 6.

Referring to FIG. 7, chromium film 6 of approximately 300 nm in film thickness is formed all over gate insulation film 5 by sputtering. Then, predetermined photolithography is applied to obtain resist patterns 63a and 63b required to form a pattern of a gate electrode at each of regions R1 and R2. The length S1 of resist pattern 63a in the direction of the gate length is set longer than the length S2 of resist pattern 63b in the direction of the gate length.

Figure 8:
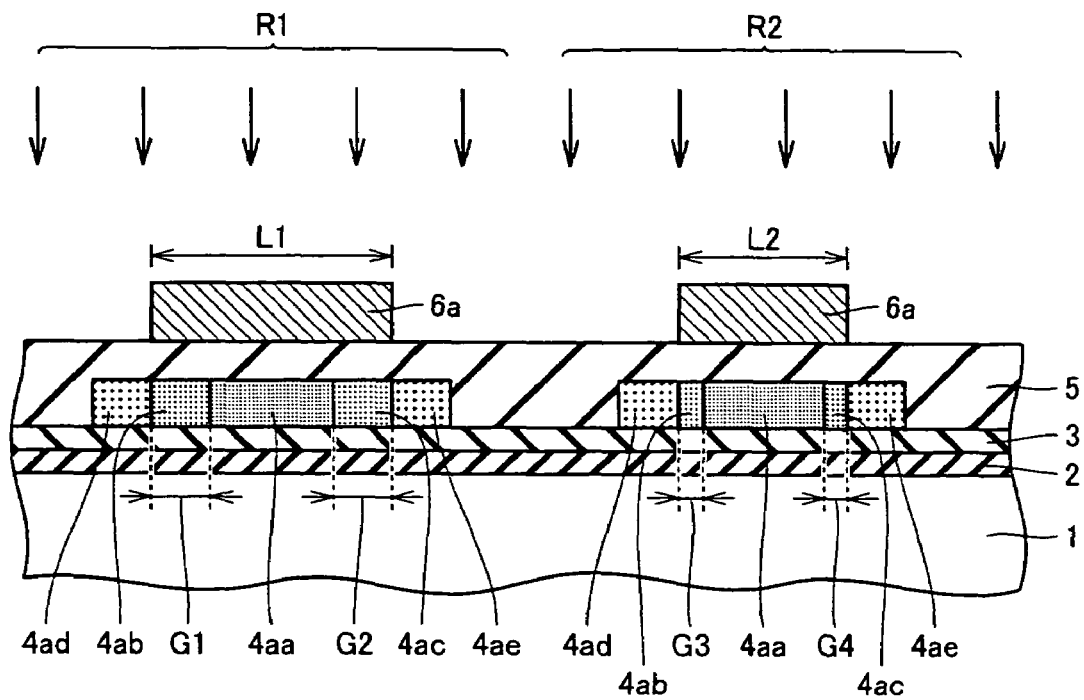
FIG. 8 is a sectional view of the TFT array substrate of the first embodiment, representing a step carried out after the step of FIG. 7.

Then, chromium film 6 is subjected to dry etching using resist patterns 63a and 63b as masks, to obtain gate electrode 6a at each of regions R1 and R2, as shown in FIG. 8. At this stage, the width of gate electrode 6a at region R1 (length in direction of gate length) is L1, whereas the width of gate electrode 6a at region R2 (length in direction of gate length) is L2. Subsequently, ashing and chemical treatment are applied to remove resist patterns 63a and 63b.

In the case where a gate electrode is to be formed by wet etching, it is desirable to form a resist pattern having a dimension reflecting the decrease in dimension of the resist pattern by the wet etching process.

Then, phosphorus is implanted with a dosage of $3\times10^{15}$ atom/cm$^2$ and acceleration energy of 80 KeV, for example, using gate electrode 6a as a mask to obtain impurity region 4ad and impurity region 4ae identified as the source region and drain region, respectively, of thin film transistor T1 at impurity regions 4ab and 4ac, respectively, located at region R1. Impurity regions 4ad and 4ae have an impurity concentration of $5\times10^{20}$ atom/cm$^3$.

At impurity regions 4ab and 4ac located at region R2, an impurity region 4ad and an impurity region 4ae identified as the source region and the drain region, respectively, of thin film transistor T2 are formed.

Figure 9:
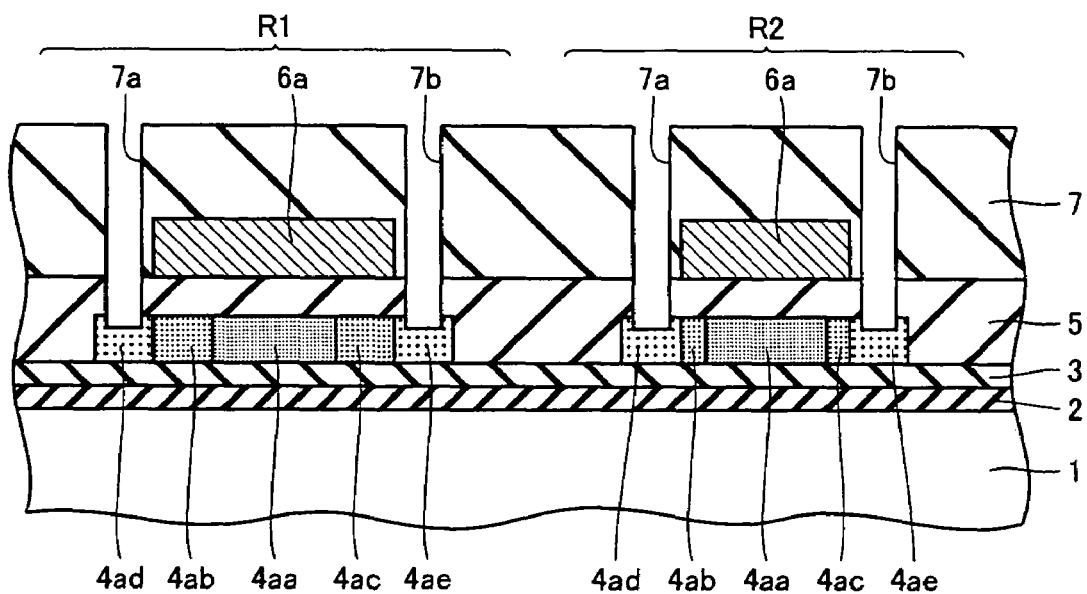
FIG. 9 is a sectional view of the TFT array substrate of the first embodiment, representing a step carried out after the step of FIG. 8.

Referring to FIG. 9, interlayer insulation film 7 of a silicon oxide film is formed to a thickness of approximately 500 nm by plasma CVD, for example, so as to cover gate electrode 6a. Then, predetermined photolithography is applied on interlayer insulation film 7 to obtain a resist pattern (not shown) required to form a contact hole. Using this resist pattern as a mask, interlayer insulation film 7 and gate insulation film 5 are subjected to anisotropic etching to form contact hole 7a and contact hole 7b exposing the surface of impurity region 4ad and impurity region 4ae, respectively, at respective regions R1 and R2.

Then, a multilayer film of a chromium film and aluminum film (not shown) is formed on interlayer insulation film 7 so as to fill contact holes 7a and 7b. Predetermined photolithography is applied on the multilayer film, whereby a resist pattern (not shown) required to form an electrode is obtained. Then, wet etching is applied using that resist pattern as a mask to obtain a source electrode 8a and a drain electrode 8b.

Through the steps set forth above, the main part of a TFT array substrate including thin film transistors T1 and T2 of FIG. 2 is formed. At thin film transistors T1 and T2, impurity region 4ad and impurity region 4ae are identified as source region 45 and drain region 46, respectively. Impurity regions 4ab and 4ac are identified as GOLD regions 41 and 42, respectively. Impurity region 4aa is identified as channel region 40.

By forming thin film transistors of different GOLD length on one glass substrate 1 in the above-described TFT array substrate, a thin film transistor having the optimum GOLD length corresponding to the property required in circuitry can be employed. Furthermore, formation of thin film transistors having different GOLD lengths allows the occupying area of the thin film transistor to be reduced. This will be described in detail hereinafter.

In a TFT array substrate used in a liquid crystal display device, the driving voltage of circuitry cannot be lowered in uniformity in order to ensure a constant contrast and a predetermined voltage to drive the liquid crystal.

It is to be noted that the driving voltage can be reduced by rendering the film thickness of the liquid crystal thin. However, the light of the backlight cannot be blocked sufficiently if the thickness of the liquid crystal is too thin. Black cannot be displayed clearly, leading to deterioration in the contrast. Therefore, the voltage to drive the liquid crystal cannot be set below 5V in a liquid crystal display device.

In order to ensure 5V as the voltage to drive the liquid crystal, the driving voltage of pixel thin film transistor 22 of pixel unit 21, power supply circuit 33 to supply a power supply voltage to pixel unit thin film transistor 22, counter electrode driving circuit 32, tone voltage circuit 34, and the thin film transistor employed in source driver 30 transferring pixel data to pixel unit thin film transistor 22 is set to 5V. The driving voltage of the thin film transistor in other circuitry is set to 3.3V.

By the usage of two different voltages as the driving voltage, it is desirable that the source-drain breakdown voltage of the thin film transistor corresponds to the driving voltage.

Figure 10:
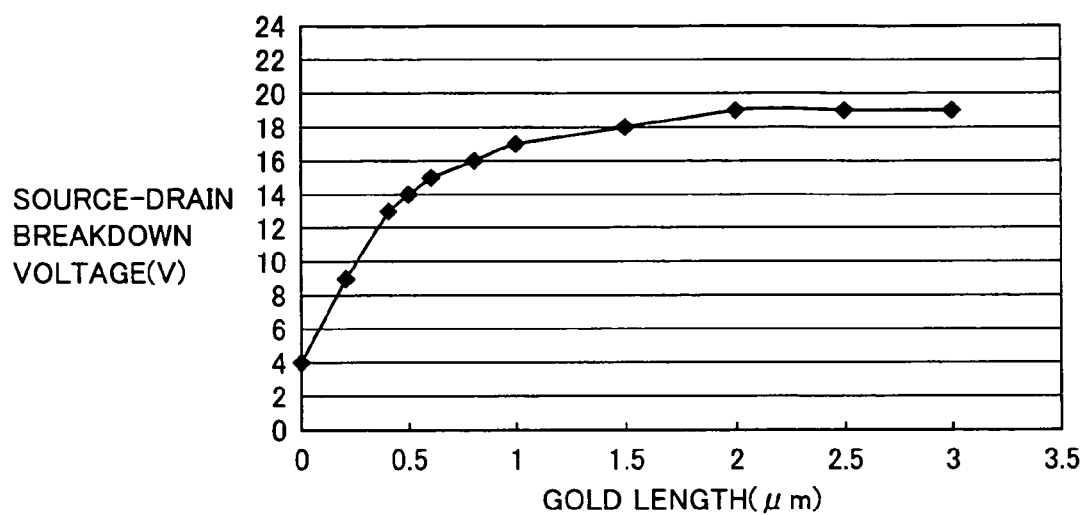
FIG. 10 is a graph representing the relationship between the GOLD length and source-drain breakdown voltage in the first embodiment.

The relationship between the GOLD length and source-drain breakdown voltage in a thin film transistor is shown in FIG. 10. It is appreciated from FIG. 10 that the source-drain breakdown voltage increases as the GOLD length becomes longer, and is apt to be saturated with almost no improvement when the GOLD length exceeds 2 μm. It is appreciated that the source-drain breakdown voltage of the thin film transistor is approximately 13V and 18V when the GOLD length is 0.5 μm and 1.5 μm, respectively.

In the TFT substrate of the liquid crystal display device of the present embodiment, a thin film transistor having a GOLD length of 0.5 μm is employed as the thin film transistor in circuitry based on voltage 3.3V such as signal control circuit 35. A thin film transistor having a GOLD length of 1.5 μm is employed as the thin film transistor in circuitry based on the voltage of 5V such as the circuit to drive the liquid crystal. From the standpoint of reliability, the source-drain breakdown voltage is preferably set to at least 3 times the working voltage.

Thus, a thin film transistor of a relatively long GOLD length is employed in a circuit where the voltage is high, and a thin film transistor of a relatively short GOLD length is employed in a circuit where the voltage is low in the above-described TFT array substrate.

Since the driving voltage cannot be reduced as set forth above in a thin film transistor used in a liquid crystal display device, a relatively long GOLD length, for example approximately 1.5 μm, must be set, as compared to a transistor used in a general LSI (Large Scale Integrated Circuit). The GOLD length of a thin film transistor used in a general LSI is approximately 0.1 μm.

The area occupied by the thin film transistor varies greatly depending upon the GOLD length of the thin film transistor. For example, the area occupied by one thin film transistor having a GOLD length of 0.5 μm, a gate width of 10 μm, and an effective gate length of 3 μm is approximately 160 μm$^2$, excluding the source electrode and the drain electrode. In contrast, the area occupied by one thin film transistor having a GOLD length of 1.5 μm is approximately 180 μm$^2$.

This means that, if the GOLD length of all thin film transistors in the TFT array substrate is set to 1.5 μm, the area occupied by the thin film transistors at the TFT array substrate will be increased significantly.

By employing a thin film transistor having a GOLD length of 0.5 μm and a thin film transistor having a GOLD length of 1.5 μm in the TFT array substrate of the above-described liquid crystal display device, an area of approximately 20 μm$^2$ can be reduced per one thin film transistor having a GOLD length of 0.5 μm than the area occupied by one thin film transistor having a GOLD length of 1.5 m. This corresponds to approximately 11% of the area occupied by one thin film transistor having a GOLD length of 1.5 μm.

Assuming that there are approximately 10000 thin film transistors having a GOLD length of 0.5 μm with respect to all the thin film transistors formed on the TFT array substrate, the thin film transistor occupying area can be reduced to approximately 0.2 mm$^2$ (20 μm$^2$×10000).

Furthermore, by employing a thin film transistor having a relatively short GOLD length at circuits where the voltage is low in the above-described TFT array substrate of a liquid crystal display device, the parasitic capacitance of the thin film transistor is reduced to achieve the effect of increasing the operating rate, as will be described hereinafter.

The difference 20 μm$^2$ in the occupying area between the thin film transistor having a GOLD length of 0.5 μm and a thin film transistor having a GOLD length of 1.5 μm is the area of the GOLD region. As shown in FIG. 2, such GOLD regions 41 and 42 are formed at the polycrystalline silicon film, and face gate electrodes 6a with a thin gate insulation film 5 therebetween. Therefore, the parasitic capacitance between the GOLD region and gate electrode becomes greater as the area of the GOLD regions increases. By reducing the area of the GOLD region, the parasitic capacitance between the GOLD region and the gate region is also reduced, allowing improvement of the operating rate of the circuit.

The liquid crystal display device set forth above was described based on an example in which the impurity concentration of GOLD regions 41 and 42 in thin film transistor T1 is 1×10$^{18}$ atom/cm$^3$. The impurity concentration of GOLD regions 41 and 42 is not limited to this level. The source-drain breakdown voltage can be improved as long as the GOLD regions have an impurity concentrations higher than that of channel region and lower than that of source and drain regions 45 and 46.

In order to ensure sufficient source-drain breakdown voltage, the impurity concentration of GOLD regions 41 and 42 is preferably at least 1×10$^{17}$ atom/cm$^3$ and not more than 1×10$^{19}$ atom/cm$^3$.

The liquid crystal display device set forth above was described based on an example in which two types of the working voltage, i.e. 3.3V and 5V, is employed. A liquid crystal display device including a circuit that operates at a voltage lower than 3.3V can also be envisaged. In such a liquid crystal display device, a thin film transistor absent of a GOLD region can be formed at the TFT array substrate.

Figure 11:
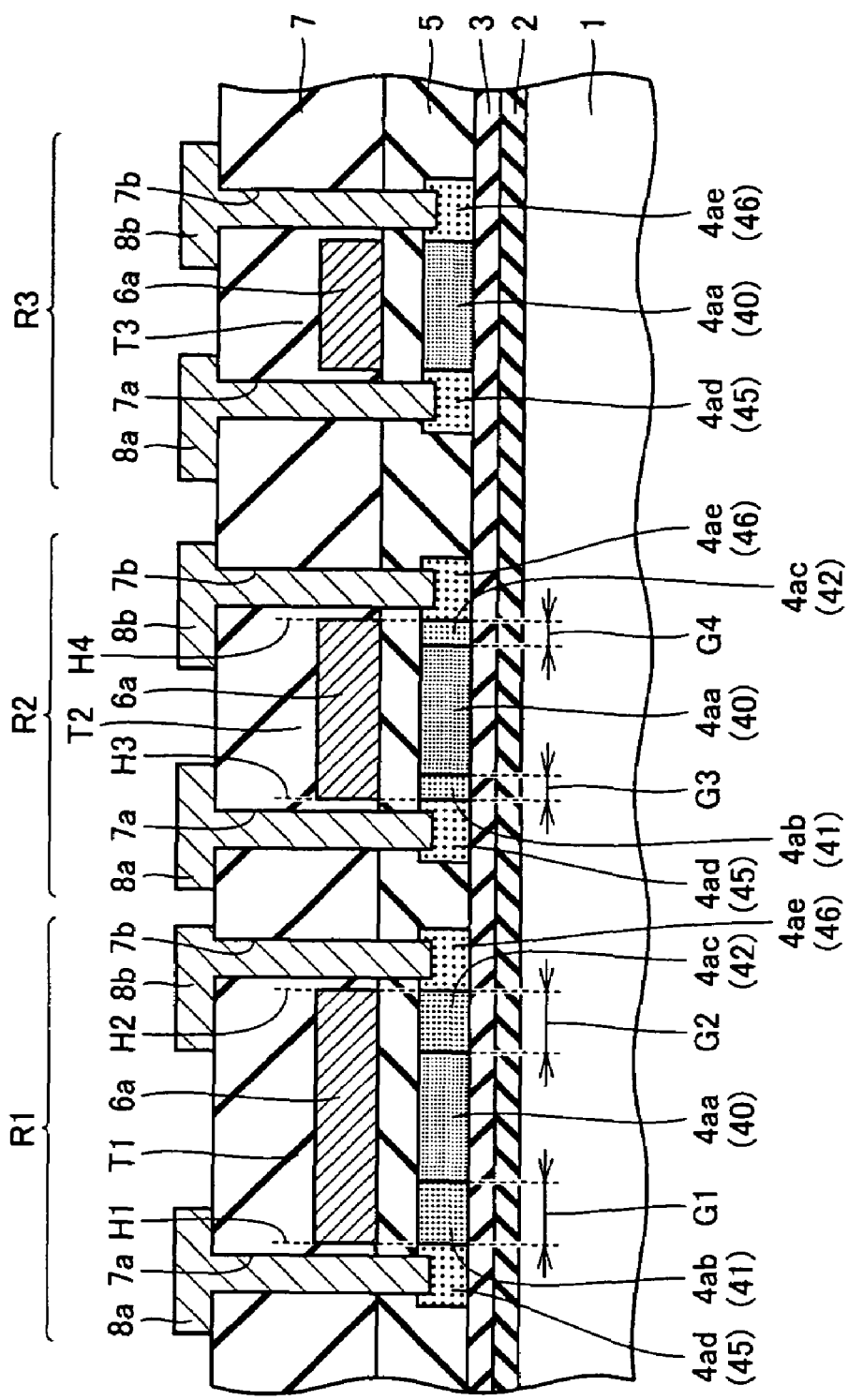
FIG. 11 is a sectional view of a TFT array substrate of a liquid crystal display device according to a modification of the first embodiment.

Specifically, as shown in FIG. 11, thin film transistors T1 and T2 including respective GOLD regions are formed at regions R1 and R2, and a thin film transistor T3 absent of a GOLD region is formed at region R3. Thin film transistor T3 is employed at circuitry that operates at a voltage lower than 3.3V. Gate electrode 6a, source region 45, drain region 46 and channel region 40 constitute thin film transistor T3.

The usage of a thin film transistor T3 absent of a GOLD region at circuits operating at a lower voltage than 3.3V in a liquid crystal display device allows the thin film transistor occupying area to be further reduced, as compared to the case where a thin film transistor with a GOLD region is employed in such a circuit of further lower voltage. Although the present embodiment was described based on an n type thin film transistor as the thin film transistor, a p type thin film transistor can also be employed.

Second Embodiment

The second embodiment is directed to a TFT array substrate of a liquid crystal display device including a thin film transistor having an LDD region in addition to a GOLD region.

Figure 12:
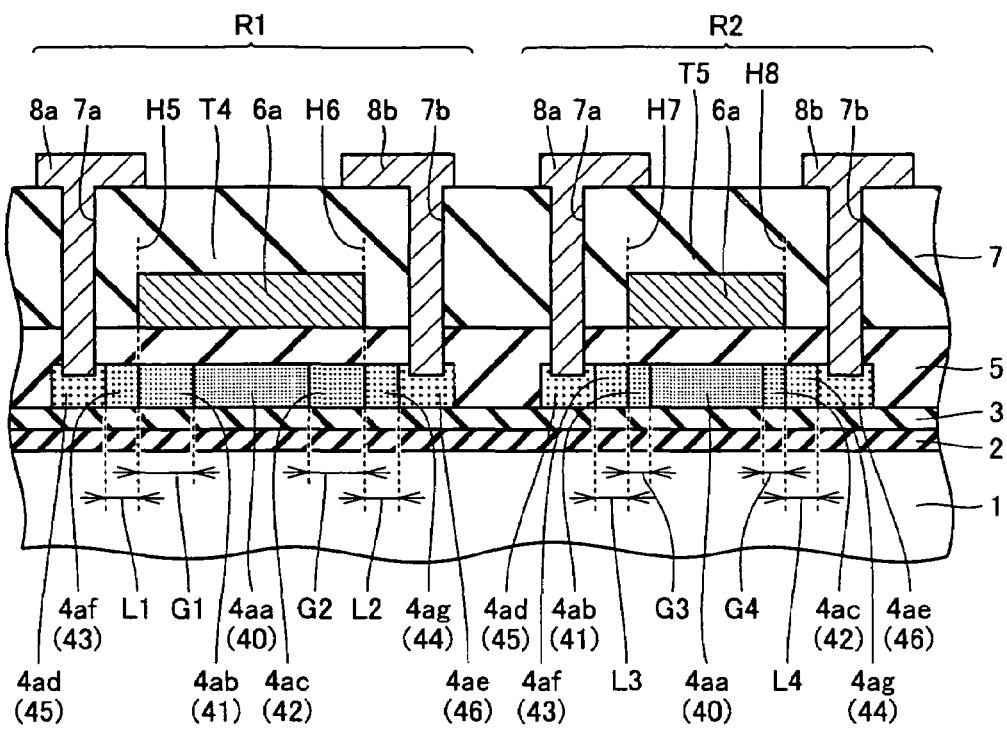
FIG. 12 is a sectional view of a TFT array substrate of a liquid crystal display device according to a second embodiment of the present invention.

Referring to FIG. 12, source region 45 having a predetermined impurity concentration and drain region 46 having a predetermined concentration with a distance from source region 45 are formed at the polycrystalline silicon film located at region R1. Channel region 40 having a predetermined channel length is formed at the region between source region 45 and drain region 46 with respective distances therefrom.

At the region between source region 45 and channel region 40, an LDD region 43 is formed at the side of source region 45 and a GOLD region 41 is formed at the side of channel region 40. At the region between drain region 46 and channel region 40, an LDD region 44 is formed at the side of drain region 46, and GOLD region 42 is formed at the side of channel region 40.

At region R1, a thin film transistor T4 is implemented including channel region 40, source region 45, drain region 46, GOLD regions 41 and 42, LDD regions 43 and 44, and gate electrode 6a.

At the polycrystalline silicon film located at region R2, channel region 40, source region 45, drain region 46, GOLD regions 41 and 42, and LDD regions 43 and 44 having a predetermined impurity concentration are formed, likewise region R1. At region R2, a thin film transistor T5 is implemented by channel region 40, source region 45, drain region 46, GOLD regions 41 and 42, LDD regions 43 and 44, and gate electrode 6a.

The remaining configuration is similar to that shown in FIG. 2. Corresponding elements have the same reference characters allotted, and the description thereof will not be repeated.

Gate electrode 6a in each of thin film transistors T4 and T5 is formed covering channel region 40 entirely, and overlapping in plane with GOLD regions 41 and 42.

In other words, at thin film transistor T4, the junction between one GOLD region 41 and LDD region 43 is located substantially on the same plane H5 as one side of gate electrode 6a, whereas the junction between the other GOLD region 42 and LDD region 44 is located substantially on the same plane H6 as the other side of gate electrode 6a.

At thin film transistor T5, the junction between one GOLD region 41 and LDD region 43 is located substantially on the same plane H7 as the one side of gate electrode 6a, whereas the junction between the other GOLD region 42 and LDD region 44 is located substantially on the same plane H8 as the other side of gate electrode 6a.

At thin film transistors T4 and T5, source region 45 as well as drain region 46 includes phosphorus as the impurity at the concentration of $5\times10^{20}$ atom/cm$^3$. GOLD regions 41 and 42 include phosphorus as the impurity at the concentration of $1\times10^{18}$ atom/cm$^3$. LDD regions 43 and 44 include phosphorus as the impurity at the concentration of $5\times10^{18}$ atom/cm$^3$. Channel region 40 does not include impurities that are electrically active.

GOLD lengths G1 and G2 of GOLD regions 41 and 42, respectively, of thin film transistor T4 are both set to 2.0 μm. GOLD lengths G3 and G4 of GOLD regions 41 and 42, respectively, of thin film transistor 5 are both set to 0.5 μm. Lengths L1 and L2 of LDD regions 43 and 44, respectively, in the direction of the channel length (LDD length) of thin film transistor T4 as well as LDD lengths L3 and L4 of LDD regions 43 and 44, respectively, of thin film transistor T5 are all set to 0.5 μm.

Figure 13:
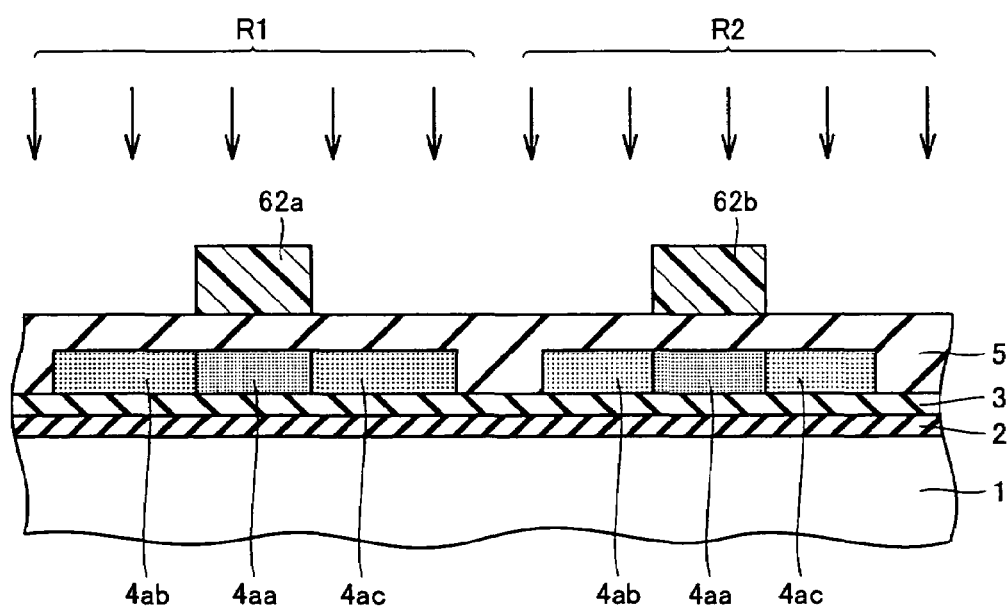
FIG. 13 is a sectional view of the TFT array substrate of the second embodiment shown in FIG. 12, representing a step in a fabrication method thereof

A fabrication method of the TFT array substrate of a liquid crystal display device set forth above will be described hereinafter. Following a process corresponding to the steps shown in FIGS. 1-5 described in the first embodiment, predetermined photolithography is applied in a manner similar to the step of FIG. 6 to obtain, as shown in FIG. 13, resist pattern 62a required for the formation of thin film transistor T4 at region R1, and resist pattern 62b required for the formation of thin film transistor T5 at region R2.

Using resist patterns 62a and 62b as masks, phosphorus is implanted into impurity region 4aa with a dosage of $7\times10^{12}$ atom/cm$^2$ and acceleration energy of 80 KeV, for example, to obtain impurity regions 4ab and 4ac at regions R1 and R2, respectively. The implanted amount thereof corresponds to the amount of implantation of the GOLD region ($1\times10^{18}$ atom/cm$^3$). Then, ashing and chemical treatment are applied to remove resist patterns 62a and 62b.

Figure 14:
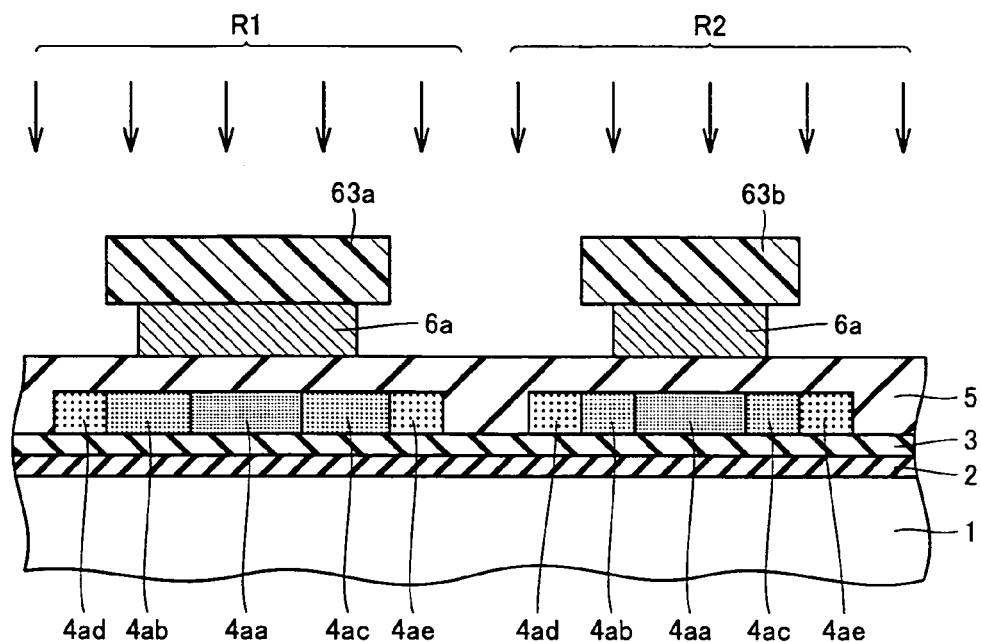
FIG. 14 is a sectional view of the TFT array substrate of the second embodiment, representing a step carried out after the step of FIG. 13.

Through a step similar to that shown in FIG. 7, resist patterns 63a and 63b (refer to FIG. 14) required to form a pattern of a gate electrode at each of regions R1 and R2 are formed. The chromium film is subjected to wet etching using resist patterns 63a and 63b as masks to obtain gate electrode 6a at each of regions R1 and R2, as shown in FIG. 14. The side of the chromium film exposed is etched away during the wet etching process. The amount of etching thereof can be controlled by the duration of overetching.

Using resist patterns 63a and 63b as masks, phosphorus is implanted into impurity regions 4ab and 4ac with a dosage of $8\times10^{14}$ atom/cm$^2$ and acceleration energy of 80 KeV, for example, to obtain impurity regions 4ad and 4ae identified as the source region and drain region, respectively. The impurity concentration of impurity regions 4ad and 4ae is $5\times10^{20}$ atom/cm$^3$. Then, ashing and chemical treatment are applied to remove resist patterns 63a and 63b.

Figure 15:
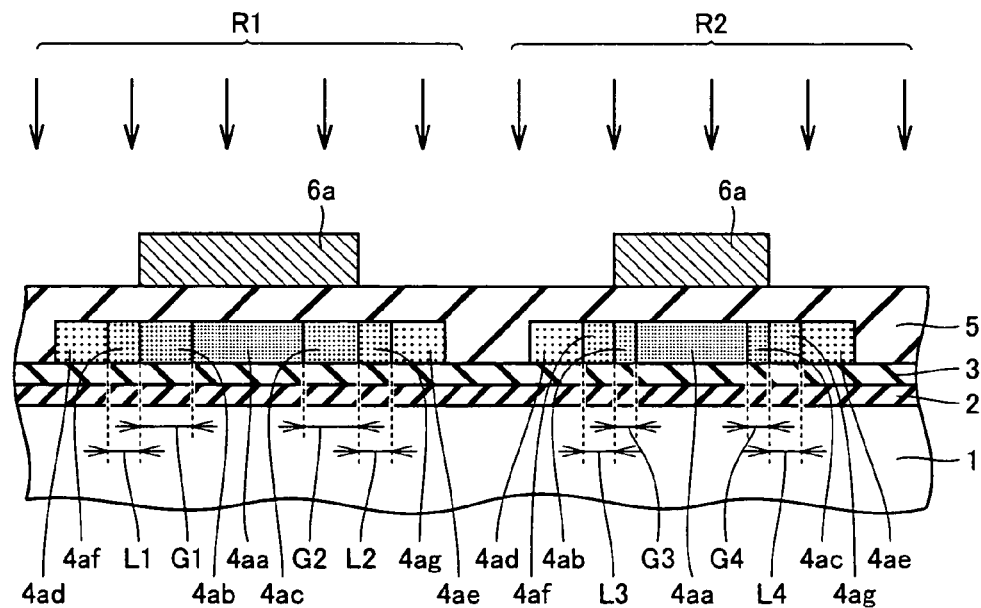
FIG. 15 is a sectional view of the TFT array substrate of the second embodiment, representing a step carried out after the step of FIG. 14.

Referring to FIG. 15, by implanting phosphorus with a dosage of $3\times10^{13}$ atom/cm$^2$ and acceleration energy of 80 KeV, for example, using gate electrode 6a as a mask, impurity regions 4af and 4ag identified as the LDD region are obtained at the remaining impurity regions 4ab and 4ac. The impurity concentration of impurity regions 4af and 4ag ($5\times10^{18}$ atom/cm$^3$) is determined by this implanted amount of phosphorus and the implanted amount of phosphorus directed to the formation of the GOLD region.

By the formation of impurity regions 4af and 4ag identified as the LDD region, the impurity concentration of impurity regions 4af and 4ag becomes higher than that of impurity regions 4ab and 4ac identified as the GOLD region.

Through a step similar to that shown in FIG. 9, the main part of a TFT array substrate including thin film transistors T4 and T5 shown in FIG. 12 is obtained.

In addition to the advantage of employing optimum thin film transistors T4 and T5 in accordance with the property required at the circuit by virtue of forming thin film transistors T4 and T5 having different GOLD lengths on one glass substrate in the TFT array substrate set forth above, the source-drain breakdown voltage of thin film transistors T4 and T5 can be further improved by virtue of thin film transistors T4 and T5 having LDD regions.

Further higher voltage (circuit voltage) can be accommodated by such further improvement of the source-drain breakdown voltage of thin film transistors T4 and T5. In other words, the above-described TFT array substrate can be employed as a TFT array substrate to increase the operating rate such as for motion picture display, or as a TFT array substrate directed to a large screen or the like having higher resolution.

It is to be particularly noted that the operating frequency of source driver 30 (frequency of data line 26) becomes higher as the resolution is increased. For example, in the case of the VGA (Video Graphics Array) resolution, the number of pixels is 640×480, and the operating frequency of the data line required for relevant driving is 25 MHz. In the case of the XGA (eXtended Graphics Array) resolution, the number of pixels is 1024×768, and the operating frequency of the data line required for relevant driving is increased up to 65 MHz. The power supply voltage must be increased to achieve a higher operating rate for the operation of a TFT array substrate directed to a large screen.

In the TFT array substrate of the liquid crystal display of the present embodiment, the driving voltage of source driver 30 (refer to FIG. 1) is boosted to 7V to achieve higher speed in operation. A thin film transistor having a GOLD length of 2.0 μm is employed as the thin film transistor in the circuit used under the voltage of 7V such as the circuit of source driver 30. In contrast, a thin film transistor having a GOLD length of 0.5 μm is employed as the thin film transistor in the circuit that is used under the voltage of 3.3 V such as signal control circuit 35.

In the above-described TFT array substrate of a liquid crystal display device, the source-drain breakdown voltage can be further improved by the formation of an LDD region in addition to the GOLD region in the thin film transistor.

Furthermore, by employing a thin film transistor having a relatively long GOLD length at the circuit where the voltage is high and employing a thin film transistor having a relatively short GOLD length at the circuit where the voltage is low, the area occupied by thin film transistors can be reduced, as described above.

Third Embodiment

The third embodiment is directed to a TFT array substrate including thin film transistors T1 and T2 described in the first embodiment and thin film transistors T4 and T4 described in the second embodiment, as a variation of a TFT array substrate of a liquid crystal display device.

Figure 16:
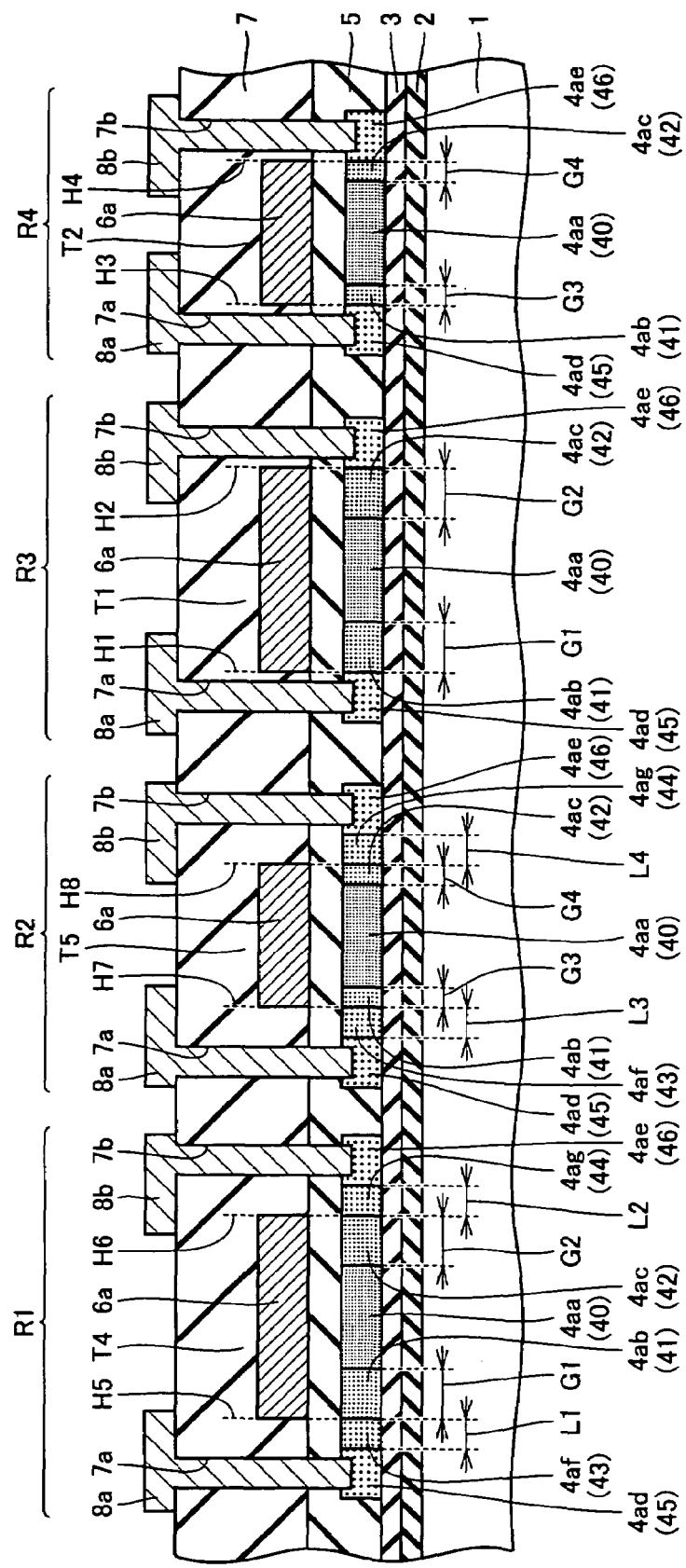
FIG. 16 is a sectional view of a TFT array substrate of a liquid crystal display device according to a third embodiment of the present invention.

As shown in FIG. 16, thin film transistors T4 and T5 including both the GOLD region and LDD region are formed at regions R1 and R2, respectively, at the TFT array substrate. At regions R3 and R4, thin film transistors T1 and T2 including the GOLD region and absent of the LDD region are formed. The basic configuration is similar to that described in respective FIGS. 2 and 12. Corresponding elements have the same reference characters allotted, and the description thereof will not be repeated.

At thin film transistor T1, GOLD lengths G1 and G2 of GOLD regions 41 and 42 are both set to 1.5 μm. At thin film transistor T2, GOLD lengths G3 and G4 of GOLD regions 41 and 42 are both set to 0.5 μm.

At thin film transistor T4, GOLD lengths G1 and G2 of GOLD regions 41 and 42 are both set to 2.0 μm. The lengths L1 and L2 of LDD regions 43 and 44 in the direction of the channel length (LDD length) are both set to 0.5 μm. At thin film transistor T5, GOLD lengths G3 and G4 of GOLD regions 41 and 42 are both set to 0.05 μm. LDD lengths L3 and L4 of LDD regions 43 and 44 are both set to 0.5 μm.

Thus, four different types of thin film transistors T1, T2, T4, and T5 each having a different source-drain breakdown voltage are formed on glass substrate 1 at the TFT array substrate. Accordingly, four different types of voltages can be used in the liquid crystal display device.

When the driving voltage of the liquid crystal (pixel capacitance 23) is raised from 5V to 6V, for example, to increase the liquid crystal response rate at the liquid crystal display device, voltages of four types of 7V, 6V, 5V and 3.3V are used.

At the TFT array substrate of a liquid crystal display device of the present embodiment, thin film transistor T4 is employed as the thin film transistor of the circuit used under the voltage of 7V such as source driver 30. As the thin film transistor at a circuit used under the voltage of 6V such as tone voltage circuit 34 and counter electrode driving circuit 32, thin film transistor T5 is employed.

As the thin film transistor in a circuit used under the voltage of 5V such as gate driver 31 and power supply circuit 33, thin film transistor T1 is employed. As the thin film transistor in a circuit used under the voltage of 3.3V such as signal control circuit 35, thin film transistor T2 is employed.

By employing appropriate thin film transistors having GOLD lengths corresponding to the voltage in the above-described TFT array substrate of the liquid crystal display device, the thin film transistor occupying area can be reduced, as compared to the case where all the thin transistors at the TFT array substrate are set to have a GOLD length corresponding to the highest voltage.

Furthermore, by employing thin film transistors T4 and T5 including the LDD region in addition to the GOLD region, the source-drain breakdown voltage is improved to allow accommodation of further higher voltage. Therefore, the operating rate of the liquid crystal display device can be improved.

The fabrication method of thin film transistors T1 and T2 including the GOLD region and absent of the LDD region and thin film transistors T4 and T5 including both the GOLD region and LDD region on the same substrate is set forth below. At the step of FIG. 13, the GOLD regions of each of thin film transistors T1, T2, T4, and T5 are formed at respective regions R1, R2, R3, and R4. At the step of FIG. 14, regions R3 and R4 are covered with a resist pattern to disallow formation of a gate electrode in thin film transistors T1 and T2. Then, thin film transistors T1 and T2 of regions R3 and R4 are to be formed using another mask (resist pattern). The method described in the first and second embodiments can be applied as the specific fabrication method.

The reason why an n channel type thin film transistor is taken as an example as the thin film transistor including a GOLD region in the TFT array substrate of a liquid crystal display device in the above-described embodiments will be described hereinafter. The carrier in an n type transistor is an electron, whereas the carrier in a p type transistor is a hole. Since avalanche breakdown occurs more easily at an n channel type thin film transistor due to the smaller carrier effective mass for electrons than for holes in a semiconductor, the source-drain breakdown voltage becomes lower. It is therefore desirable to include a GOLD region in an n type thin film transistor.

Since electrons have a small effective mass and the barrier height of electrons to a silicon oxide film (energy difference between the conduction band of silicon and the conduction band of silicon oxide film=3.1 eV) is lower than the barrier height of holes to a silicon oxide film (energy difference between the valance band of silicon and the valance band of silicon oxide film=3.8 eV), electrons are more easily introduced into the gate insulation film (silicon oxide film). The gate insulation film will be more susceptible to damage. As compared to a p channel thin film transistor, an n channel thin film transistor has the element property more easily degraded to result in reliability loss. Thus, from the standpoint of ensuring reliability, it is desirable that an n type thin film transistor includes a GOLD region.

The present invention is not limited to an n type thin film transistor as a thin film transistor including a GOLD region. A p type thin film transistor including a GOLD region may be used.

The above embodiments were described in which the TFT array substrate of the liquid crystal display device includes a thin film transistor of a GOLD region with three types (0.5 μm, 1.5 μm, and 2.0 μm) for the GOLD length. However, the GOLD length is not limited thereto, and an appropriate GOLD length corresponding to the voltage to be used can be employed. Such a GOLD length is preferably at least 0.1 μm and not more than 2.0 μm.

The upper limit is set to 2.0 μm since there is essentially no improvement in the source-drain breakdown voltage when the GOLD length exceeds 2 μm, which will lead to increase of the thin film transistor occupying area. The reason why the lower limit is set to 0.1 μm is will be described hereinafter.

In an image display device employing a thin film transistor, there may be the case where all the signals are to be processed by the thin film transistors to improve the degree of freedom in design. The circuit incorporated into the TFT array substrate will increase if all the signals are to be processed at the TFT array substrate. To minimize increase of the substrate area, microminiaturization of thin film transistors is required. When such a microscopic thin film transistor is to be operated at the power supply voltage of 1.8V or a relatively low voltage of approximately 1.3V, for example, sufficient source-drain breakdown voltage can be ensured if the GOLD length is at least 0.1 μm. In other words, microminiaturization of a thin film transistor can be achieved while ensuring the source-drain breakdown voltage when the GOLD length is at least 0.1 μm.

Respective embodiments of a thin film transistor set forth above are described based on a planar type thin film transistor having a gate electrode formed with the gate insulation film therebetween on a semiconductor layer where a source region, a drain region, and the like are formed.

A thin film transistor of a liquid display device of the present invention is not limited to such a planar type thin film transistor. A reverse stagger type thin film transistor having a semiconductor layer that is to function as a source region and a drain region and the like formed on a gate electrode with a gate insulation film therebetween may be employed.

In any event, the junction between one GOLD region and LDD region is located substantially on the same plane as the one side of the electrode, whereas the junction between the other GOLD region and LDD region is located substantially on the same plane as the other side of the electrode in a thin film transistor including a GOLD region and LDD region.

At a thin film transistor including the GOLD region and absent of the LDD region, the junction between one GOLD region and source region is located substantially on the same plane as the one side of the electrode, whereas the junction between the other GOLD region and drain region is located substantially on the same plane as the other side of the electrode.

The above embodiments were described in which a non-alkali glass substrate is employed as a substrate. However, any material that transmits light can be used for the substrate. For example, a quartz substrate, or the like can be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a plurality of semiconductor elements, each having a semiconductor layer, an insulation film, and an electrode formed on a predetermined substrate, wherein each of said plurality of semiconductor elements comprises a first impurity region formed at said semiconductor layer, and having a predetermined impurity concentration, a second impurity region formed at said semiconductor layer with a distance from said first impurity region, and having a predetermined impurity concentration, a channel region functioning as a channel having a predetermined channel length, formed at a region of said semiconductor layer between said first impurity region and said second impurity region with respective distances from said first impurity region and said second impurity region, a third impurity region formed in contact with said channel region at a region of said semiconductor layer between said first impurity region and said channel region, and having a constant impurity concentration in a direction parallel to the length of the channel lower than the impurity concentration of said first impurity region, and a fourth impurity region formed in contact with said channel region at a region of said semiconductor layer between said second impurity region and said channel region, and having a constant impurity concentration in a direction parallel to the length of the channel lower than the impurity concentration of said second impurity region, wherein, in each of said plurality of semiconductor elements, said insulation film is formed between said semiconductor layer and said electrode so as to come into contact with each of said semiconductor layer and said electrode, said electrode has one side and another side opposite to each other, and is formed overlapping with and facing said channel region, a portion of said third impurity region, and a portion of said fourth impurity region, and an overlapping region between said electrode and said third impurity region arranged facing each other, starting from a region where a plane including said one side intersects said semiconductor layer up to said channel region, and an overlapping region between said electrode and said fourth impurity region arranged facing each other, starting from a region where a plane including said another side intersects said semiconductor layer up to said channel region have a predetermined overlapping length in a direction of the channel length, said plurality of semiconductor elements including a first element having a first overlapping length as said predetermined overlapping length, and a second element having a second overlapping length shorter than said first overlapping length as said predetermined overlapping length.

2. The semiconductor device according to claim 1, said plurality of semiconductor elements including a third element having a third overlapping length as said predetermined overlapping length, and a fourth element having a fourth overlapping length shorter than said third overlapping length as said predetermined overlapping length, wherein each of said third and fourth elements comprises a fifth impurity region formed at said semiconductor layer starting from a region where a plane including said one side of said electrode intersects said semiconductor layer up to said first impurity region, and a sixth impurity region formed at said semiconductor layer starting from a region where a plane including said another side of said electrode intersects said semiconductor layer up to said second impurity region.

3. The semiconductor device according to claim 2, wherein said first to fourth elements are formed on a same substrate as said predetermined substrate.

4. The semiconductor device according to claim 2, comprising a pixel unit for displaying an image, formed of a plurality of pixels, and
a driving circuit unit to drive said pixel unit,
wherein said pixel unit and said driving circuit unit are formed of at least one of said first element and said third element.

5. The semiconductor device according to claim 2, wherein said first to fourth elements are n channel transistors.

6. The semiconductor device according to claim 2, wherein the impurity concentration of said third impurity region and said fourth impurity region is set lower than the impurity concentration of said fifth impurity region and said sixth impurity region.

7. The semiconductor device according to claim 2, wherein said first to fourth overlapping lengths are set in a range of at least 0.1 μm and not more than 2 μm.

8. The semiconductor device according to claim 1, wherein the impurity concentration of said third impurity region and said fourth impurity region is at least $1\times10^{17}$ atom/cm$^3$ and not more than $1\times10^{19}$ atom/cm$^3$.

9. The semiconductor device according to claim 1, wherein said predetermined substrate is one of a glass substrate and a quartz substrate.

10. The semiconductor device according to claim 1, wherein said semiconductor layer is formed of polycrystalline silicon.

* * * * *